United States Patent
He et al.

(10) Patent No.: US 10,594,310 B2
(45) Date of Patent: Mar. 17, 2020

(54) FULL-SCALE RANGE ENHANCEMENT IN A DUAL-PATH PULSE WIDTH MODULATION PLAYBACK SYSTEM

(71) Applicant: Cirrus Logic International Semiconductor Ltd., Edinburgh (GB)

(72) Inventors: Ku He, Austin, TX (US); Tejasvi Das, Austin, TX (US); Xin Zhao, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/144,104

(22) Filed: Sep. 27, 2018

(65) Prior Publication Data

US 2019/0260365 A1 Aug. 22, 2019

Related U.S. Application Data

(60) Provisional application No. 62/631,535, filed on Feb. 16, 2018.

(51) Int. Cl.
*H03K 7/08* (2006.01)
*G05F 1/575* (2006.01)
*H03G 3/00* (2006.01)

(52) U.S. Cl.
CPC ............ *H03K 7/08* (2013.01); *G05F 1/575* (2013.01); *H03G 3/001* (2013.01)

(58) Field of Classification Search
CPC ........ H03K 7/08; H03G 3/001; H03G 3/3005; G05F 1/575
See application file for complete search history.

(56) References Cited

U.S. PATENT DOCUMENTS

| | | | | |
|---|---|---|---|---|
| 8,624,857 B2 * | 1/2014 | Cheung | ................... | G06F 3/016 345/156 |
| 2006/0028188 A1 * | 2/2006 | Hartular | ................ | H02M 3/156 323/273 |
| 2006/0158165 A1 * | 7/2006 | Inn | ......................... | G05F 1/575 323/280 |

* cited by examiner

*Primary Examiner* — Vineeta S Panwalkar
(74) *Attorney, Agent, or Firm* — Jackson Walker L.L.P.

(57) ABSTRACT

A method may include, in a system comprising a digital PWM subsystem having a tunable digital gain, a first path coupled to an output of the digital PWM subsystem and configured to drive an open-loop driver stage, and a second path coupled to the output of the digital PWM subsystem and configured to drive a closed-loop driver stage having a tunable analog gain: selecting one of the first path and the second path for processing an input signal to generate an output signal based on one or more characteristics of the input signal, setting the digital gain to a maximum digital gain and the analog gain to a minimum analog gain when the input signal is lesser than a first threshold, setting the digital gain to a minimum digital gain and the analog gain to a maximum analog gain when the input signal is greater than a second threshold magnitude, and varying the analog gain and the digital gain when the input signal is in a range greater than the first threshold and lesser than a second threshold.

26 Claims, 5 Drawing Sheets

FULL-SCALE RANGE ENHANCEMENT IN A DUAL-PATH PULSE WIDTH MODULATION PLAYBACK SYSTEM

RELATED APPLICATION

The present disclosure claims priority to U.S. Provisional Patent Application Ser. No. 62/631,535, filed Feb. 16, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop pulse width modulation (PWM) amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either open-loop or closed-loop depending on the specific application may be desirable. When using such a single PWM amplifier circuit, perceptible audio artifacts may occur when switching between open-loop operation and closed-loop operation, and thus, it may be desirable to reduce or eliminate such audio artifacts.

In addition, in such a system including a dual-path playback system switchable between an open-loop playback path and a closed-loop playback path, a low-dropout (LDO) regulator may be used as a power supply to a driver stage of each of the open-loop playback path and the closed-loop playback path. An LDO regulator may be used to maximize a power supply rejection ratio for the system, but because the LDO regulated voltage may be lower than its input supply voltage, attenuation may be introduced into the output signal in both the open-loop playback path and closed-loop playback path. Accordingly, effective compensation is needed for both of the playback paths.

SUMMARY

In accordance with the teachings of the present disclosure, one or more disadvantages and problems associated with existing approaches to processing signals with an amplifier may be reduced or eliminated.

In accordance with embodiments of the present disclosure, a system may include a digital pulse width modulator subsystem having a tunable digital gain, a first path coupled to an output of the digital pulse width modulator subsystem and configured to drive an open-loop driver stage, a second path coupled to the output of the digital pulse width modulator subsystem and configured to drive a closed-loop driver stage having a tunable analog gain, wherein the open-loop driver stage and the closed-loop driver stage are powered from a low-dropout (LDO) regulator that generates a supply voltage shared by the open-loop driver stage and the closed-loop driver stage, and a control subsystem. The control subsystem may be configured to select one of the first path and the second path for processing an input signal to generate an output signal based on one or more characteristics of the input signal, set the tunable digital gain to a maximum tunable digital gain and the tunable analog gain to a minimum tunable analog gain to compensate for an LDO attenuation of the LDO regulator when a magnitude of the input signal is lesser than a first threshold magnitude, set the tunable digital gain to a minimum tunable digital gain and the tunable analog gain to a maximum tunable analog gain to compensate for an LDO attenuation of the LDO regulator when a magnitude of the input signal is greater than a second threshold magnitude, and vary the tunable analog gain and the tunable digital gain to compensate for the LDO attenuation when the magnitude of the input signal is in a range greater than the first threshold magnitude and lesser than the second threshold magnitude by increasing the tunable analog gain and decreasing the tunable digital gain as the magnitude of the input signal increases within the range and decreasing the tunable analog gain and increasing the tunable digital gain as the magnitude of the input signal decreases within the range.

In accordance with these and other embodiments of the present disclosure, a method may include, in a system comprising a digital pulse width modulator subsystem having a tunable digital gain, a first path coupled to an output of the digital pulse width modulator subsystem and configured to drive an open-loop driver stage, and a second path coupled to the output of the digital pulse width modulator subsystem and configured to drive a closed-loop driver stage having a tunable analog gain, wherein the open-loop driver stage and the closed-loop driver stage are powered from a low-dropout (LDO) regulator that generates a supply voltage shared by the open-loop driver stage and the closed-loop driver stage: selecting one of the first path and the second path for processing an input signal to generate an output signal based on one or more characteristics of the input signal; setting the tunable digital gain to a maximum tunable digital gain and the tunable analog gain to a minimum tunable analog gain to compensate for an LDO attenuation of the LDO regulator when a magnitude of the input signal is lesser than a first threshold magnitude; setting the tunable digital gain to a minimum tunable digital gain and the tunable analog gain to a maximum tunable analog gain to compensate for an LDO attenuation of the LDO regulator when a magnitude of the input signal is greater than a second threshold magnitude; and varying the tunable analog gain and the tunable digital gain to compensate for the LDO attenuation when the magnitude of the input signal is in a range greater than the first threshold magnitude and lesser than the second threshold magnitude by increasing the tunable analog gain and decreasing the tunable digital gain as the magnitude of the input signal increases within the range and decreasing the tunable analog gain and increasing the tunable digital gain as the magnitude of the input signal decreases within the range.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
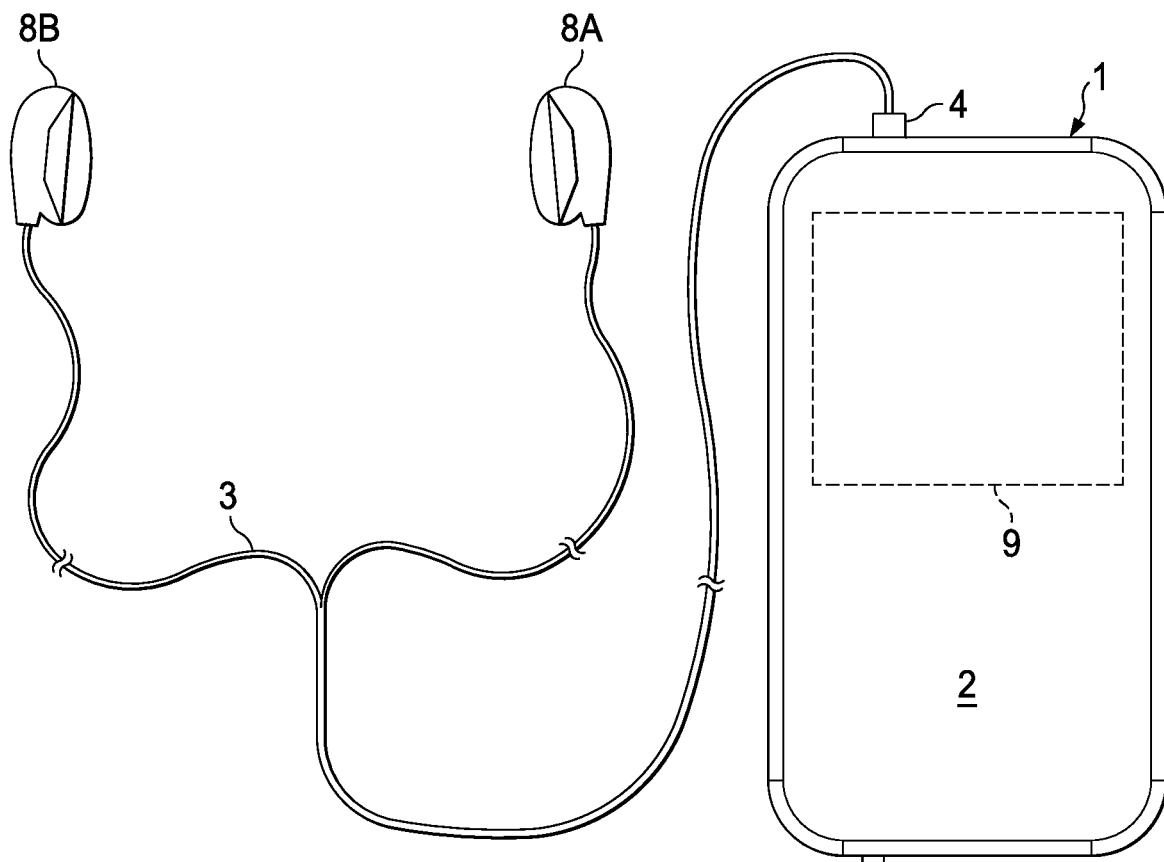
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
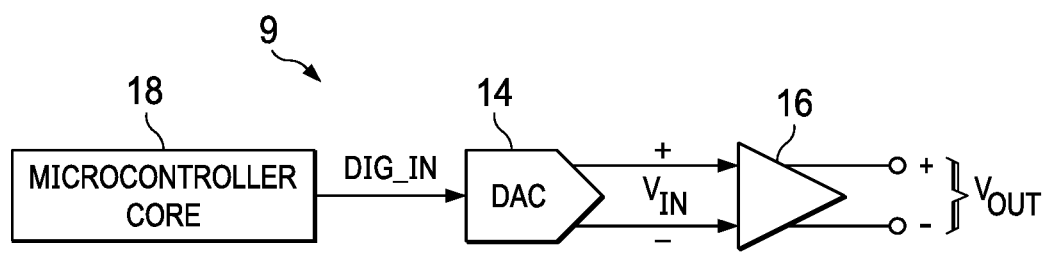
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
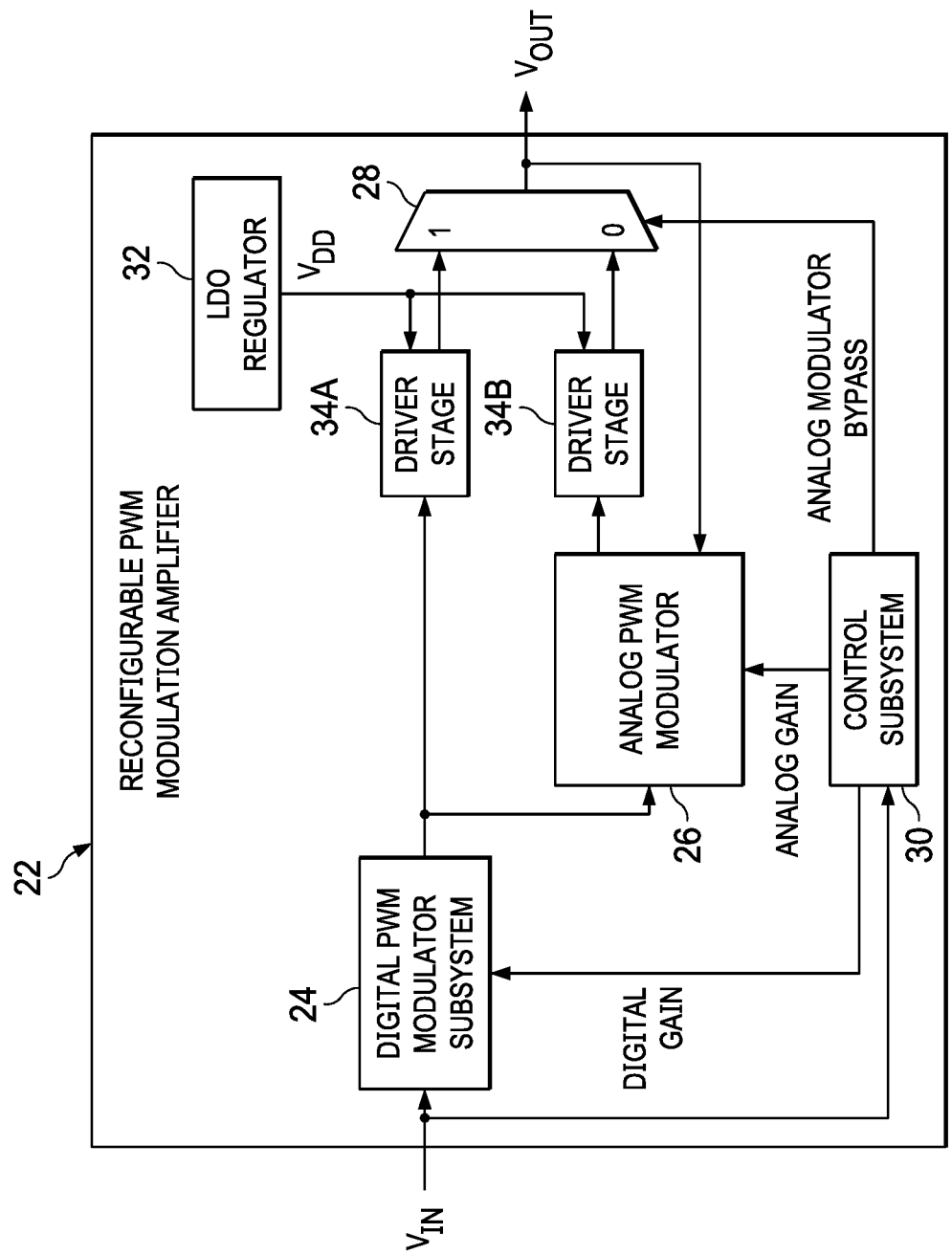
FIG. 3 is a block diagram of selected components of an example pulse width modulation amplifier, in accordance with embodiments of the present disclosure.

FIG. 3 is a block diagram of selected components of an example reconfigurable pulse width modulation amplifier 22, in accordance with embodiments of the present disclosure. In some embodiments, example reconfigurable pulse width modulation amplifier 22 may be used to implement amplifier 16 of FIG. 2. As shown in FIG. 3, example reconfigurable pulse width modulation amplifier 22 may include a digital PWM modulator subsystem 24 and an analog PWM modulator 26, along with a direct bypass function implemented with a multiplexer 28.

Reconfigurable PWM modulation amplifier 22 may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26. Also as shown in FIG. 3, an LDO regulator 32 may generate a supply voltage $V_{DD}$ that may supply electrical energy to driver stage 34B, such that driver stage 34B may use such electrical energy to generate output signal $V_{OUT}$.

Reconfigurable PWM modulation amplifier 22 may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24. Also as shown in FIG. 3, LDO regulator 32 may supply electrical energy via supply voltage $V_{DD}$ to driver stage 34A, such that driver stage 34A may use such electrical energy to generate output signal $V_{OUT}$.

Changing reconfigurable PWM modulation amplifier 22 from the analog closed-loop mode and the digital open-loop mode (and vice versa) may be achieved by, through use of multiplexer 28, selecting which of driver stage 34A and driver stage 34B is to drive output signal $V_{OUT}$. Although FIG. 3 and other figures herein depict, for the purposes of clarity and exposition, that the selection of which of driver stage 34A and driver stage 34B is to drive output signal $V_{OUT}$ is controlled by multiplexer 28, any other suitable system, device, or apparatus may be used to select between the output of driver stage 34A and driver stage 34B to generate output signal $V_{OUT}$, whether or not such system, device, or apparatus is similar in structure and/or logical functionality as multiplexer 28.

In some embodiments, a control subsystem 30 may be used to control multiplexer 28 in order to select a signal processing path for reconfigurable PWM modulation amplifier 22, for example by generating the ANALOG MODULATOR BYPASS control signal communicated from control subsystem 30 to multiplexer 28. For example, selection of such multiplexer control signal may be based on one or more characteristics of input signal $V_{IN}$ to the amplifier (e.g., magnitude, frequency, or other characteristic of input signal $V_{IN}$). Thus, reconfigurable PWM modulation amplifier 22 may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems. However, the foregoing system may be susceptible to attenuation in the signal paths due to LDO regulator 32 being used as a power supply to driver stages 34A and 34B. Accordingly, as described in greater detail below, control subsystem 30 may also be configured to control a digital gain of digital PWM modulator subsystem 24 using a control signal DIGITAL GAIN as shown in FIG. 3 and/or configured to control an analog gain of analog PWM modulator 26 using a control signal ANALOG GAIN as shown in FIG. 3, in order to compensate for an LDO attenuation of LDO regulator 32.

Figure 4:
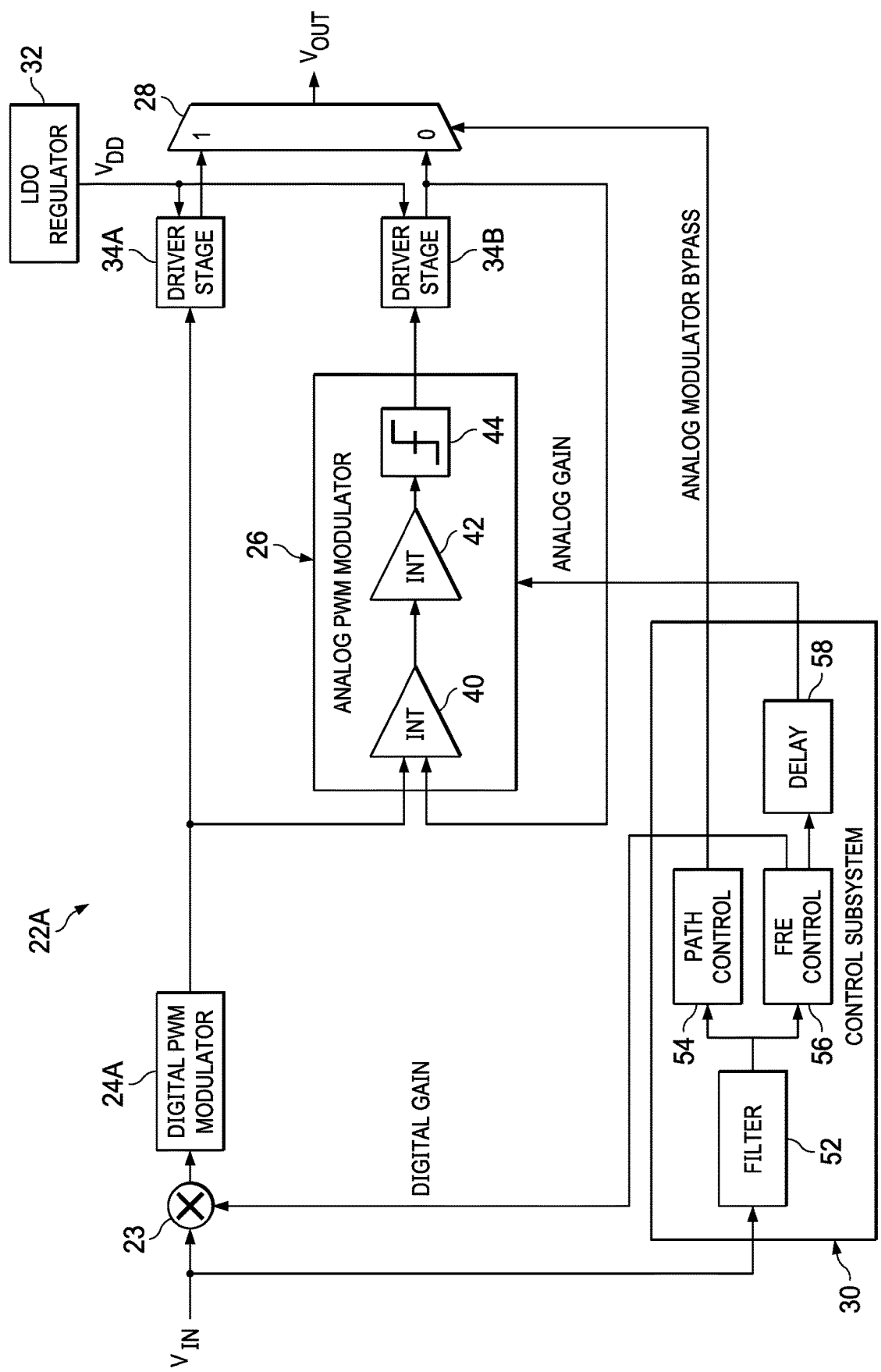
FIG. 4 is a block diagram of selected components of an example reconfigurable PWM modulator, in accordance with embodiments of the present disclosure.

FIG. 4 is a block diagram of selected components of an example reconfigurable PWM modulation amplifier 22A, in accordance with embodiments of the present disclosure. In some embodiments, reconfigurable PWM modulation amplifier 22A may be used to implement reconfigurable PWM modulation amplifier 22 of FIG. 3. As shown in FIG. 4, digital PWM modulator subsystem 24 may be implemented using a single digital PWM modulator 24A and a gain element 23 having a digital gain tunable by control signal DIGITAL GAIN generated by control subsystem 30. Also as shown in FIG. 4, analog PWM modulator 26 may include a first-stage integrator 40 followed by one or more additional stage integrators 42, which are in turn followed by a quantizer 44 that may generate an analog PWM signal to driver stage 34B. Although not explicitly shown in FIG. 4, analog PWM modulator 26 may have an analog gain tunable by control signal ANALOG GAIN generated by control subsystem 30. The tunable analog gain may be controlled in any manner, including without limitation varying a supply voltage which supplies electrical energy to quantizer 44 and/or varying impedances of one or more components (e.g., feedforward and/or feedback resistors not shown in FIG. 4, feedforward capacitors not shown in FIG. 4) of analog PWM modulator 26.

As shown in FIG. 4, control subsystem 30 may include a filter 52, a path control block 54, a full-scale range enhancement (FRE) control block 56, and a configurable delay 58. Filter 52 may receive input signal $V_{IN}$ and apply filtering (e.g., low-pass filtering) to input signal $V_{IN}$ to generate a filtered input signal $V_{IN}$ communicated to path control block 54 and FRE control block 56. In some embodiments, filter 52 may comprise a low-pass filter to filter out-of-band noise in input signal $V_{IN}$ so that operations performed by control subsystem 30 are performed based only upon in-band signal content. However, in addition, filter 52 may be a low-latency filter, such that filter 52 performs filtering while minimizing path latency associated with detection of magnitude of input signal $V_{IN}$ by control subsystem 30.

Path control block 54 may receive filtered input signal $V_{IN}$ and, based on one or more characteristics (e.g., magnitude and/or frequency) of filtered input signal $V_{IN}$ (which may be indicative of analogous characteristics of unfiltered input signal $V_{IN}$), select (e.g., by communicating an appropriate ANALOG MODULATOR BYPASS control signal to multiplexer 28) one of open-loop playback path comprising driver stage 34A and the closed-loop playback path comprising analog PWM modulator and driver stage 34B as the signal path for generating output signal $V_{OUT}$. Accordingly, in some embodiments, path control block 54 may include a level estimator configured to estimate the magnitude of input signal $V_{IN}$ based on filtered input signal $V_{IN}$. As an example of the functionality of path control block 54, for magnitudes of filtered input signal $V_{IN}$ below a threshold magnitude, path control block 54 may select the open-loop playback path and for magnitudes of filtered input signal $V_{IN}$ above the threshold magnitude, path control block 54 may select the closed-loop playback path. In some embodiments, path control block 54 may apply hysteresis to the switching between the open-loop playback path and the closed-loop playback path, such that a first threshold magnitude is applied for switching from the closed-loop playback path to the open-loop playback path and a second threshold magnitude higher than the first threshold magnitude is applied for switching from the open-loop playback path to the closed-loop playback path.

FRE control block 56 may receive filtered input signal $V_{IN}$ and, based on one or more characteristics (e.g., magnitude and/or frequency) of filtered input signal $V_{IN}$ (which may be indicative of analogous characteristics of unfiltered input signal $V_{IN}$) control the tunable digital gain of gain element 23 and the tunable analog gain of analog PWM modulator 26 to implement full-scale range enhancement of reconfigurable PWM modulation amplifier 22A by generating appropriate control signals DIGITAL GAIN and ANALOG GAIN appropriately. Accordingly, in some embodiments FRE control block 56 may include a level estimator configured to estimate the magnitude of input signal $V_{IN}$ based on filtered input signal $V_{IN}$. In some embodiments, path control block 54 and FRE control block 56 may share a level estimator. In other embodiments, path control block 54 and FRE control block 56 may each have their own level estimator.

As shown in FIG. 4, control subsystem 30 may include a configurable delay 58 to delay the generation of control signal ANALOG GAIN relative to generation of control signal DIGITAL GAIN to compensate for path delay associated with the closed-loop path (e.g., delays introduced by digital PWM modulator 24 and analog PWM modulator 26).

Figure 5:
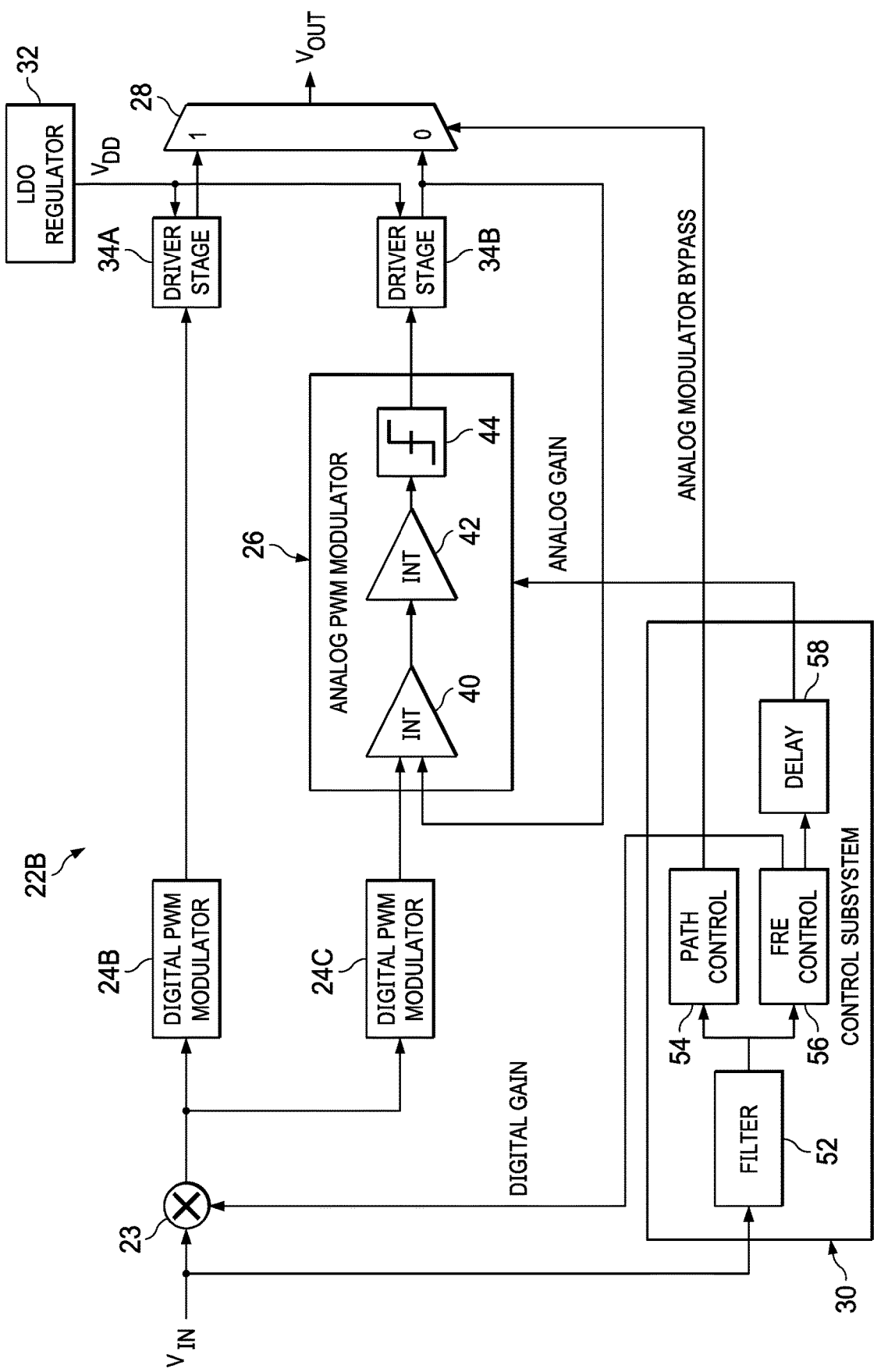
FIG. 5 is a block diagram of selected components of another example reconfigurable PWM modulator, in accordance with embodiments of the present disclosure.

FIG. 5 is a block diagram of selected components of another example reconfigurable PWM modulation amplifier 22B, in accordance with embodiments of the present disclosure. In some embodiments, reconfigurable PWM modulation amplifier 22B may be used to implement reconfigurable PWM modulation amplifier 22 of FIG. 3. Reconfigurable PWM modulation amplifier 22B of FIG. 5 may in many respects be similar to reconfigurable PWM modulation amplifier 22A of FIG. 4. Accordingly, only the main differences between reconfigurable PWM modulation amplifier 22A and reconfigurable PWM modulation amplifier 22B may be described in detail. The main material difference is that in reconfigurable PWM modulation amplifier 22B, digital PWM modulation subsystem 24 of FIG. 3 may be implemented using a first digital PWM modulator 24B and a second digital PWM modulator subsystem 24C. Digital PWM modulator 24B may drive open-loop driver stage 34A while digital PWM modulator 24C may drive analog PWM modulator 26.

Figure 6:
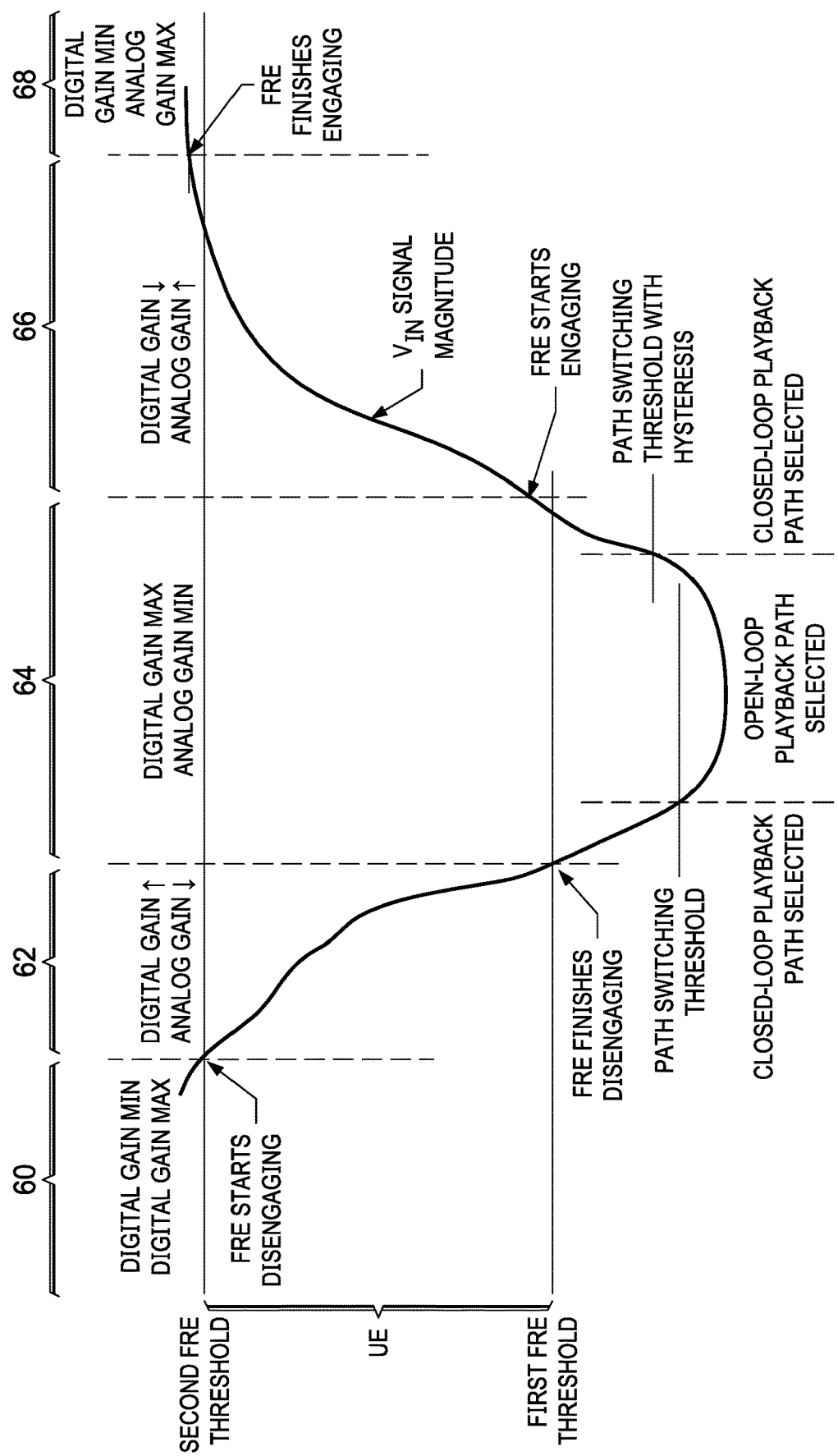
FIG. 6 is a graphical representation of performance of full-scale range enhancement, in accordance with embodiments of the present disclosure.

In operation, as detailed in FIG. 6, FRE control block 56 may implement full-scale range enhancement of a reconfigurable PWM modulation amplifier 22 (e.g., reconfigurable PWM modulation amplifier 22A or reconfigurable PWM modulation amplifier 22B) by varying the tunable digital gain of gain element 23 and the tunable analog gain of analog PWM modulator 26 within an FRE range between a first FRE threshold magnitude and a second FRE threshold magnitude. As shown in region 64 of FIG. 6, for magnitudes of input signal $V_{IN}$ below the first FRE threshold magnitude, FRE control block 56 may set the tunable digital gain to a maximum tunable digital gain and the tunable analog gain to a minimum tunable analog gain to compensate for an LDO attenuation of LDO regulator 32. As shown in regions 60 and 68 of FIG. 6, for magnitudes of input signal $V_{IN}$ above the second FRE threshold magnitude, FRE control block 56 may set the tunable digital gain to a minimum tunable digital gain and the tunable analog gain to a maximum tunable analog gain to compensate for an LDO attenuation of LDO regulator 32. Within the FRE range between the first FRE threshold magnitude and the second FRE threshold magnitude, FRE control block 56 may vary the tunable analog gain and the tunable digital gain to compensate for the LDO attenuation by increasing the tunable analog gain and decreasing the tunable digital gain as the magnitude of the input signal increases within the range (as shown in region 66 of FIG. 6) and decreasing the tunable analog gain and increasing the tunable digital gain as the magnitude of the input signal decreases within the range (as shown in region 62 of FIG. 6).

In addition, as shown in FIG. 6, a path switching threshold for input signal $V_{IN}$ may be at a magnitude lower than the first FRE threshold such that for a decreasing magnitude of input signal $V_{IN}$, FRE control block 56 may finish varying the tunable digital gain and the tunable analog gain prior to path control block 54 switching selection between the closed-loop playback path and the open-loop playback path, so that overall path gains of the open-loop playback path and closed-loop playback path are appropriately matched prior to the path switching, in order to minimize the occurrence of audio artifacts upon path switching. To further minimize audio artifacts upon path switching, path control block 54 may also be configured to, for at least some path switching events, causing switching of a selected path to be carried out at a zero crossing of an input signal (e.g., input signal $V_{IN}$) and/or a zero crossing of a pulse width modulation signal (e.g., output signal $V_{OUT}$) derived from the input signal within the system.

In addition, to minimize audio artifacts associated with varying the tunable digital gain and the tunable analog gain, FRE control block 56 may be configured to vary such gains at a zero crossing of an input signal (e.g., input signal $V_{IN}$) and/or a zero crossing of a pulse width modulation signal (e.g., output signal $V_{OUT}$) derived from the input signal within the system. In some embodiments, FRE control block 56 may be configured to predict, at the time of occurrence of the zero crossing, whether input signal $V_{IN}$ will cross, after the occurrence of the zero crossing, a magnitude threshold (e.g., either of the first threshold or the second threshold) for modifying the tunable digital gain and the tunable analog gain. For example, FRE control block 56 may be configured to predict that input signal $V_{IN}$ will cross the magnitude threshold responsive to the input signal crossing another magnitude threshold lesser than the magnitude threshold. As another example, FRE control block 56 may be configured to predict that input signal $V_{IN}$ will cross the magnitude threshold responsive to the input signal crossing another magnitude threshold lesser than the magnitude threshold, provided a rate of increase in the magnitude of the signal is greater than a threshold rate at the time of crossing of the other magnitude lesser than the magnitude threshold. As a further example, FRE control block 56 may be configured to predict that input signal $V_{IN}$ will cross the magnitude threshold based on historical data associated with input signal $V_{IN}$.

Also, to minimize audio artifacts associated with varying the tunable digital gain and the tunable analog gain, when input signal $V_{IN}$ is decreasing in magnitude within the FRE range, FRE control block 56 may be configured to slowly increase the tunable digital gain and decrease the tunable analog gain in fixed step sizes to minimize audible audio artifacts associated with increasing the tunable digital gain and decreasing the tunable analog gain. However, because of such varying of gains in small step sizes for increasing magnitudes of input signal $V_{IN}$, FRE control block 56 may be configured to, when input signal $V_{IN}$ is increasing in magnitude within the FRE range, decrease the tunable digital gain and increase the tunable analog gain instantly without fixed step size in order to minimize signal clipping.

As also shown in FIG. 6, control subsystem 30 may apply hysteresis to one or more of the various thresholds described above. For example, for decreasing magnitudes of input signal $V_{IN}$, the path switching threshold may be less than an alternative path switching threshold for increasing magnitudes of input signal $V_{IN}$. Similarly, for decreasing magnitudes of input signal $V_{IN}$, the first FRE threshold may be less than an alternative first FRE threshold for increasing magnitudes of input signal $V_{IN}$. Likewise, for decreasing magnitudes of input signal $V_{IN}$, the second FRE threshold may be less than an alternative second FRE threshold for increasing magnitudes of input signal $V_{IN}$. Such hysteresis may prevent excessive switching of gains or selected paths when a signal magnitude is approximately constant near a particular threshold magnitude level.

Although the foregoing contemplates use of reconfigurable PWM modulation amplifier 22 for use in an audio amplifier for driving an audio transducer, it is understood that reconfigurable PWM modulation amplifier 22 may be used in other types of amplifiers for driving other types of transducers, including without limitation an amplifier for driving a haptic transducer.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a digital pulse width modulator subsystem having a tunable digital gain;
   a first path coupled to an output of the digital pulse width modulator subsystem and configured to drive an open-loop driver stage;
   a second path coupled to the output of the digital pulse width modulator subsystem and configured to drive a closed-loop driver stage having a tunable analog gain, wherein the open-loop driver stage and the closed-loop driver stage are powered from a low-dropout (LDO) regulator that generates a supply voltage shared by the open-loop driver stage and the closed-loop driver stage; and
   a control subsystem configured to:
      select one of the first path and the second path for processing an input signal to generate an output signal based on one or more characteristics of the input signal;
      set the tunable digital gain to a maximum tunable digital gain and the tunable analog gain to a minimum tunable analog gain to compensate for an LDO attenuation of the LDO regulator when a magnitude of the input signal is lesser than a first threshold magnitude;
      set the tunable digital gain to a minimum tunable digital gain and the tunable analog gain to a maximum tunable analog gain to compensate for an LDO attenuation of the LDO regulator when a magnitude of the input signal is greater than a second threshold magnitude; and
      vary the tunable analog gain and the tunable digital gain to compensate for the LDO attenuation when the magnitude of the input signal is in a range greater than the first threshold magnitude and lesser than the second threshold magnitude by increasing the tunable analog gain and decreasing the tunable digital gain as the magnitude of the input signal increases within the range and decreasing the tunable analog gain and increasing the tunable digital gain as the magnitude of the input signal decreases within the range.

2. The system of claim 1, wherein the digital pulse width modulator subsystem comprises:
   a first digital pulse width modulator configured to drive the first path; and
   a second digital pulse width modulator configured to drive the second path.

3. The system of claim 1, wherein the digital pulse width modulator subsystem comprises a single pulse width modulator that drives both the first path and the second path.

4. The system of claim 1, wherein the control subsystem is further configured to modify the tunable digital gain and the tunable analog gain prior to switching selection between the first path and the second path, such that a first total path gain of the digital pulse width modulator subsystem and the first path and a second total path gain of the digital pulse width modulator subsystem and the second path are matched at the time of switching selection between the first path and the second path.

5. The system of claim 1, wherein the control subsystem is further configured to modify the tunable digital gain and the tunable analog gain at one of a zero crossing of the input signal and a zero crossing of a pulse width modulation signal derived from the input signal within the system.

6. The system of claim 5, wherein the control subsystem is further configured to predict, at the time of occurrence of the zero crossing, whether the input signal will cross a magnitude threshold for modifying the tunable digital gain and the tunable analog gain.

7. The system of claim 6, wherein the control subsystem is configured to predict that the input signal will cross the magnitude threshold responsive to the input signal crossing a second magnitude threshold lesser than the magnitude threshold.

8. The system of claim 6, wherein the control subsystem is configured to predict that the input signal will cross the magnitude threshold based on historical data associated with the input signal.

9. The system of claim 1, the control subsystem further comprising:
a filter configured to filter the input signal to generate a filtered input signal; and
a level estimator configured to estimate the magnitude of the input signal based on the filtered input signal.

10. The system of claim 9, wherein the filter comprises an offline low-pass filter used to filter out-of-band noise in the input signal and minimize path latency associated with detection of magnitude of the input signal.

11. The system of claim 1, the control subsystem further configured to apply a configurable delay to a control signal for controlling the tunable analog gain to compensate for path delay associated with the second path.

12. The system of claim 1, wherein the control subsystem is further configured to, when the input signal is decreasing in magnitude within the range, slowly increase the tunable digital gain and decrease the tunable analog gain in fixed step sizes to minimize audible audio artifacts associated with increasing the tunable digital gain and decreasing the tunable analog gain.

13. The system of claim 12, wherein the control subsystem is further configured to, when the input signal is increasing in magnitude within the range, decrease the tunable digital gain and increase the tunable analog gain instantly without fixed step size in order to minimize signal clipping.

14. A method comprising, in a system comprising a digital pulse width modulator subsystem having a tunable digital gain, a first path coupled to an output of the digital pulse width modulator subsystem and configured to drive an open-loop driver stage, and a second path coupled to the output of the digital pulse width modulator subsystem and configured to drive a closed-loop driver stage having a tunable analog gain, wherein the open-loop driver stage and the closed-loop driver stage are powered from a low-dropout (LDO) regulator that generates a supply voltage shared by the open-loop driver stage and the closed-loop driver stage:
selecting one of the first path and the second path for processing an input signal to generate an output signal based on one or more characteristics of the input signal;
setting the tunable digital gain to a maximum tunable digital gain and the tunable analog gain to a minimum tunable analog gain to compensate for an LDO attenuation of the LDO regulator when a magnitude of the input signal is lesser than a first threshold magnitude;
setting the tunable digital gain to a minimum tunable digital gain and the tunable analog gain to a maximum tunable analog gain to compensate for an LDO attenuation of the LDO regulator when a magnitude of the input signal is greater than a second threshold magnitude; and
varying the tunable analog gain and the tunable digital gain to compensate for the LDO attenuation when the magnitude of the input signal is in a range greater than the first threshold magnitude and lesser than the second threshold magnitude by increasing the tunable analog gain and decreasing the tunable digital gain as the magnitude of the input signal increases within the range and decreasing the tunable analog gain and increasing the tunable digital gain as the magnitude of the input signal decreases within the range.

15. The method of claim 14, wherein the digital pulse width modulator subsystem comprises:
a first digital pulse width modulator configured to drive the first path; and
a second digital pulse width modulator configured to drive the second path.

16. The method of claim 14, wherein the digital pulse width modulator subsystem comprises a single pulse width modulator that drives both the first path and the second path.

17. The method of claim 14, further comprising modifying the tunable digital gain and the tunable analog gain prior to switching selection between the first path and the second path, such that a first total path gain of the digital pulse width modulator subsystem and the first path and a second total path gain of the digital pulse width modulator subsystem and the second path are matched at the time of switching selection between the first path and the second path.

18. The method of claim 14, further comprising modifying the tunable digital gain and the tunable analog gain at one of a zero crossing of the input signal and a zero crossing of a pulse width modulation signal derived from the input signal within the system.

19. The method of claim 18, further comprising predicting, at the time of occurrence of the zero crossing, whether the input signal will cross a magnitude threshold for modifying the tunable digital gain and the tunable analog gain.

20. The method of claim 19, further comprising predicting that the input signal will cross the magnitude threshold responsive to the input signal crossing a second magnitude threshold lesser than the magnitude threshold.

21. The method of claim 19, further comprising predicting that the input signal will cross the magnitude threshold based on historical data associated with the input signal.

22. The method of claim 14, further comprising:
filtering the input signal to generate a filtered input signal; and
estimating the magnitude of the input signal based on the filtered input signal.

23. The method of claim 22, wherein filtering comprises filtering out-of-band noise in the input signal with an offline low-pass filter and minimizing path latency associated with detection of magnitude of the input signal.

24. The method of claim 14, further comprising applying a configurable delay to a control signal for controlling the tunable analog gain to compensate for path delay associated with the second path.

25. The method of claim 14, further comprising, when the input signal is decreasing in magnitude within the range, slowly increasing the tunable digital gain and decreasing the tunable analog gain in fixed step sizes to minimize audible audio artifacts associated with increasing the tunable digital gain and decreasing the tunable analog gain.

26. The method of claim 25, further comprising, when the input signal is increasing in magnitude within the range, decreasing the tunable digital gain and increasing the tunable analog gain instantly without fixed step size in order to minimize signal clipping.

\* \* \* \* \*